United States Patent
Iida

(10) Patent No.: US 7,470,098 B2
(45) Date of Patent: Dec. 30, 2008

(54) DETECTING APPARATUS AND DETECTING METHOD

(75) Inventor: Naruaki Iida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/871,422

(22) Filed: Oct. 12, 2007

(65) Prior Publication Data

US 2008/0100852 A1    May 1, 2008

(30) Foreign Application Priority Data

Oct. 26, 2006    (JP)    ............... 2006-291407

(51) Int. Cl.
*H01L 21/677* (2006.01)
*G03D 5/00* (2006.01)

(52) U.S. Cl. ............ 414/217; 414/939; 414/744.5; 414/333.01; 396/604; 396/611

(58) Field of Classification Search ......... 356/625–643; 414/217, 333.01, 744.5, 796.9, 939; 396/604, 396/611; 118/52, 666; 700/218
See application file for complete search history.

(56) References Cited

U.S. PATENT DOCUMENTS

| | | | | |
|---|---|---|---|---|
| 5,306,380 A | * | 4/1994 | Hiroki | .................. 156/345.32 |
| 5,474,410 A | * | 12/1995 | Ozawa et al. | ............... 414/217 |
| 5,604,443 A | * | 2/1997 | Kitamura et al. | ............ 324/754 |
| 6,402,400 B1 | * | 6/2002 | Ueda et al. | .................. 396/611 |
| 6,471,422 B1 | * | 10/2002 | Ueda et al. | .................. 396/611 |
| 6,672,779 B2 | * | 1/2004 | Ueda et al. | .................. 396/604 |
| 6,857,838 B2 | * | 2/2005 | Kuroda | .................. 414/331.01 |
| 6,915,183 B2 | * | 7/2005 | Iida et al. | .................... 700/218 |
| 7,246,985 B2 | * | 7/2007 | Ferrara | ........................ 414/217 |

FOREIGN PATENT DOCUMENTS

| | | |
|---|---|---|
| JP | 2003-110008 | 4/2003 |
| JP | 2003-218018 | 7/2003 |

* cited by examiner

*Primary Examiner*—Sang Nguyen
(74) *Attorney, Agent, or Firm*—Oblon, Spivak, McClelland, Maier & Neustadt, P.C.

(57) ABSTRACT

An optical sensor for detecting the housing state such as the thickness of a substrate in the present invention is provided at supporting arms. The supporting arms are attached to a supporting shaft. The supporting arms are in a vertical state in a state before detection of the substrate, but when detecting, the supporting shaft rotates to bring the supporting arms into a horizontal state so that the optical sensor enters a substrate housing body and is set at a predetermined detection position. Accordingly, a space for moving the optical sensor in the horizontal direction becomes unnecessary to reduce the space required for the detecting operation and the like, making it possible to reduce the size of a substrate processing apparatus in which the detecting apparatus is incorporated.

9 Claims, 13 Drawing Sheets

DETECTING APPARATUS AND DETECTING METHOD

BACKGROUND OF THE INVENTION

1. Field of the Invention

The present invention relates to a detecting apparatus and a detecting method of detecting the housing state of a substrate.

2. Description of the Related Art

In a photolithography step in manufacturing process, for example, of a semiconductor device, for example, a resist coating treatment of applying a resist solution onto a semiconductor wafer (hereinafter, referred to as a "wafer") to form a resist film, a developing treatment of developing the resist film after exposure, thermal processing performed after the resist coating treatment and before and after the developing treatment and the like are performed to form a predetermined resist pattern on the wafer.

The series of treatment and processing is performed in a coating and developing treatment apparatus incorporating a plurality of various kinds of processing and treatment units. The coating and developing treatment apparatus usually includes a cassette station for transferring in/out the wafer to/from the apparatus, a processing station in which the various kinds of treatment and processing units are installed, and an interface section for passing the wafer to/from an aligner.

In the cassette station, a mounting table on which a cassette capable of housing a plurality of wafers can be mounted, and a transfer unit for accessing the cassette mounted on the mounting table and transferring the wafer between the cassette station and the processing station, are provided. The cassette is usually configured to be able to house a plurality of wafers at multiple tiers in the vertical direction in its casing. A door for transferring-in/out the wafer is provided in one side surface of the cassette, and a door opener for opening the door is provided on the mounting table side for mounting the cassette.

When a cassette is mounted on the mounting table, the door is opened by the door opener, and the transfer unit accesses the wafer in the cassette.

Incidentally, when the cassette housing unprocessed wafers is mounted on the mounting table, a so-called mapping operation is performed for detecting the housing states such as the presence or absence, the housing attitude and the like of the wafer at each tier in the cassette. The access position of the transfer unit to the cassette is determined based on the mapping data of the mapping operation.

This mapping operation has been conventionally performed by optically detecting the housing states of the wafer by an optical sensor. This optical sensor has been conventionally attached to a detecting apparatus provided at a position adjacent to the mounting table for the cassette. The detecting apparatus includes a supporting member for supporting the optical sensor, and the supporting member is capable of sliding in the horizontal direction by means of a horizontal moving mechanism and sliding in the vertical direction by a raising and lowering drive mechanism.

When operating the detecting apparatus, the supporting member waiting outside the door opener horizontally slides a length corresponding to the thickness of the door opener and the door of the cassette to allow the optical sensor to enter the cassette, and then the supporting member is raised and lowered to allow the optical sensor to scan the wafers aligned in the vertical direction to thereby perform the mapping operation (Japanese Patent Application Laid-open No. 2003-218018).

However, since the supporting member needs to slide the length corresponding to the thickness of the door opener and the door of the cassette as describe above for the conventional detecting apparatus, a space needs to be secured for the slide between the mounting table in the cassette station and the transfer unit. Therefore, there is a problem that the footprint increases as the coating and developing treatment apparatus increases in size, failing to effectively use, for example, the space in the clean room in which coating and developing treatment apparatus is set.

SUMMARY OF THE INVENTION

The present invention has been developed in consideration of the above points, and its object is to reduce the space required for a detecting operation in a detecting apparatus for detecting the housing state of a substrate, for example, to thereby reduce the size of a substrate processing apparatus incorporating the detecting apparatus.

To achieve the above object, the present invention is a detecting apparatus for detecting housing states of substrates housed at multiple tiers vertically aligned in a housing body, the detecting apparatus being set on a transfer-in/out port side of the housing body for housing the substrates, including: an optical sensor including a light emitting part for horizontally applying a linear light and a light receiving part for receiving the light, and capable of optically detecting the housing states of the substrates; a pair of supporting arms supporting the light emitting part and the light receiving part of the optical sensor, respectively; a supporting shaft supporting the supporting arms and extended in a horizontal direction; a raising and lowering mechanism for raising and lowering the supporting shaft; and a rotation mechanism for rotating the supporting shaft to allow the optical sensor to enter the housing body and the supporting arms to fall down until the substrate is located between the light emitting part and the light receiving part.

In the present invention, in order to detect the housing states of the substrates, the optical sensor is allowed to enter the housing body by rotating the supporting shaft by the rotation mechanism. As a result, it becomes unnecessary to horizontally slide the supporting shaft, unlike the prior art. Accordingly, the space in the horizontal direction in the processing apparatus which has been conventionally secured for the slide, whereby the substrate processing apparatus incorporating the detecting apparatus of the present invention, for example, can be reduced in size.

Further, according to the present invention, the housing states of the substrates can be detected by allowing the light emitting part and the light receiving part of the optical sensor to enter the housing body in a manner to have the substrate in the housing body intervening therebetween, and then scan along the substrates in the vertical direction by the raising and lowering mechanism while the light emitting part is applying light toward the light receiving part.

The supporting shaft may be rotated to allow the supporting arms to fall down toward the transfer-in/out port of the housing body until the optical sensor is located vertically above or below the supporting shaft which is located outside the housing body.

In the case where the supporting shaft is rotated to allow the supporting arms to fall down or stand up toward the transfer-in/out port of the housing body until the optical sensor is located vertically above or below the supporting shaft located outside the housing body, the moving range of the supporting arms is a range from the position where the optical sensor enters the inside of the housing body to have the substrate intervening between its light emitting part and light receiving part to the position where the optical sensor is located vertically above or below the supporting shaft, and on the transfer-in/out port side. In other words, the supporting arms never fall down or stand up to the other side of the housing body as seen from the supporting shaft. Accordingly, in such as case, it is possible to prevent the supporting arms from interfering with an apparatus such as a transfer unit even if the apparatus is located on the other side of the housing body.

The supporting shaft may include a stopper, the rotation mechanism side may include a stopper receiving part that butts against the stopper, and the stopper and stopper receiving part may obstruct the rotation of the supporting shaft to other than a detection position and a retraction position of the supporting shaft. This can restrict the rotation range of the supporting shaft as well as the moving range of the supporting arms supported on the supporting shaft. The detection position here refers to a position where the optical sensor is in a state to be able to enter the housing body and detect the substrate. The retraction position refers to a position where even when the supporting shaft moves in the vertical direction, the supporting arms never interfere with the housing body.

The raising and lowering mechanism may be disposed at a position off the front of the transfer-in/out port of the housing body, and may raise and lower the supporting shaft to/from above the housing body. This can dispose the raising and lowering mechanism and the supporting shaft at a position off the front of the transfer-in/out port of the housing body when the detecting operation is not being performed, thus preventing the detection apparatus from hindering the transfer-in/out of the substrate to/from the housing body.

The housing state of the substrate may be the presence or absence and a housing attitude of the substrate at each tier in the housing body, and the optical sensor may be one capable of detecting the presence or absence of a substrate at each tier in the housing body, and an apparent thickness of the substrate when the substrate housed in the housing body is seen from a side.

The present invention according to another aspect is a detecting method of detecting housing states of substrates housed at multiple tiers vertically aligned in a housing body using a detecting apparatus set on a transfer-in/out port side of the housing body for housing the substrates, the detecting apparatus used in this case including: an optical sensor including a light emitting part for horizontally applying a linear light and a light receiving part for receiving the light, and capable of optically detecting the housing states of the substrates; a pair of supporting arms supporting the light emitting part and the light receiving part of the optical sensor, respectively; a supporting shaft supporting the supporting arms and extended in a horizontal direction; a raising and lowering mechanism for raising and lowering the supporting shaft; and a rotation mechanism for rotating the supporting shaft to allow the optical sensor to enter the housing body and the supporting arms to fall down until the substrate is located between the light emitting part and the light receiving part. The detecting method of the present invention includes the steps of: lowering the supporting shaft from above the housing body to a lower portion of the housing body with the supporting arms being located vertically above the supporting shaft; rotating the supporting shaft to allow the optical sensor to enter the housing body and the supporting arms to fall down until the substrate is located between the light emitting part and the light receiving pat; and raising the supporting shaft to an upper portion of the housing body while applying light from the light emitting part of the optical sensor to the light receiving part to detect the housing states of the substrates.

According to the detecting method including such steps, the presence or absence of the light blocking object between the light emitting part and the light receiving part can be detected by rotating the supporting shaft by the rotation mechanism to allow the light emitting part and the light receiving part of the optical sensor to enter the housing body in a manner to have the substrate in the housing body intervening therebetween, and further raising and lowering the light emitting part and the light receiving part by the raising and lowering mechanism.

It is also adoptable, after the detecting the housing states of the substrates, to stop the application of light from the light emitting part of the optical sensor and lower the supporting shaft to a predetermined position; to rotate the supporting shaft until the supporting arms are located vertically above the supporting shaft; and to raise the supporting shaft to above the housing body with the supporting arms being located vertically above the supporting shaft. In this case, it is not necessary to move the supporting shaft in the horizontal direction during performance of a series of detecting operation. Accordingly, it is not necessary to secure the space for movement in the horizontal direction in the processing apparatus, whereby the substrate processing apparatus incorporating the detecting apparatus of the present invention, for example, can be reduced in size as compared to the prior art.

A detecting method of the present invention according to another aspect includes the steps of: rotating the supporting shaft from a state in which the supporting arms are located vertically below the supporting shaft at an upper portion of the housing body to allow the optical sensor to enter the housing body and the supporting arms to rise until the substrate is located between the light emitting part and the light receiving part; and lowering the supporting shaft to a lower portion of the housing body while applying light from the light emitting part of the optical sensor to the light receiving part to detect the housing states of the substrates.

It is adoptable, after the detecting the housing states of the substrates, to stop the application of light from the light emitting part of the optical sensor and rotate the supporting shaft until the supporting arms are located vertically below the supporting shaft while raising the supporting shaft to the upper portion of the housing body.

According to this method, as the preparation for the supporting shaft to retract after detecting the housing states of the substrates, the supporting shaft can be rotated to return the supporting arms to vertically below it without once lowering the supporting shaft in a direction opposite to the progress direction. Accordingly, the supporting shaft can be rapidly raised.

Note that for returning the supporting arms to vertically below, the supporting shaft may be rotated to return the supporting arms to vertically below it while the supporting shaft is being raised. Further, the raising of the supporting shaft may be once stopped at a predetermined position, the supporting shaft may be rotated to return the supporting arms to vertically below it, and then the supporting shaft may be further raised.

According to the present invention, the optical sensor can enter the housing body by rotating the supporting shaft without sliding the supporting shaft in the horizontal direction, unlike the prior art, so that the space required for the detecting operation and the like can be reduced to reduce, for example, the size of the substrate processing apparatus incorporating the detecting apparatus.

DETAILED DESCRIPTION OF THE INVENTION

Figure 1:
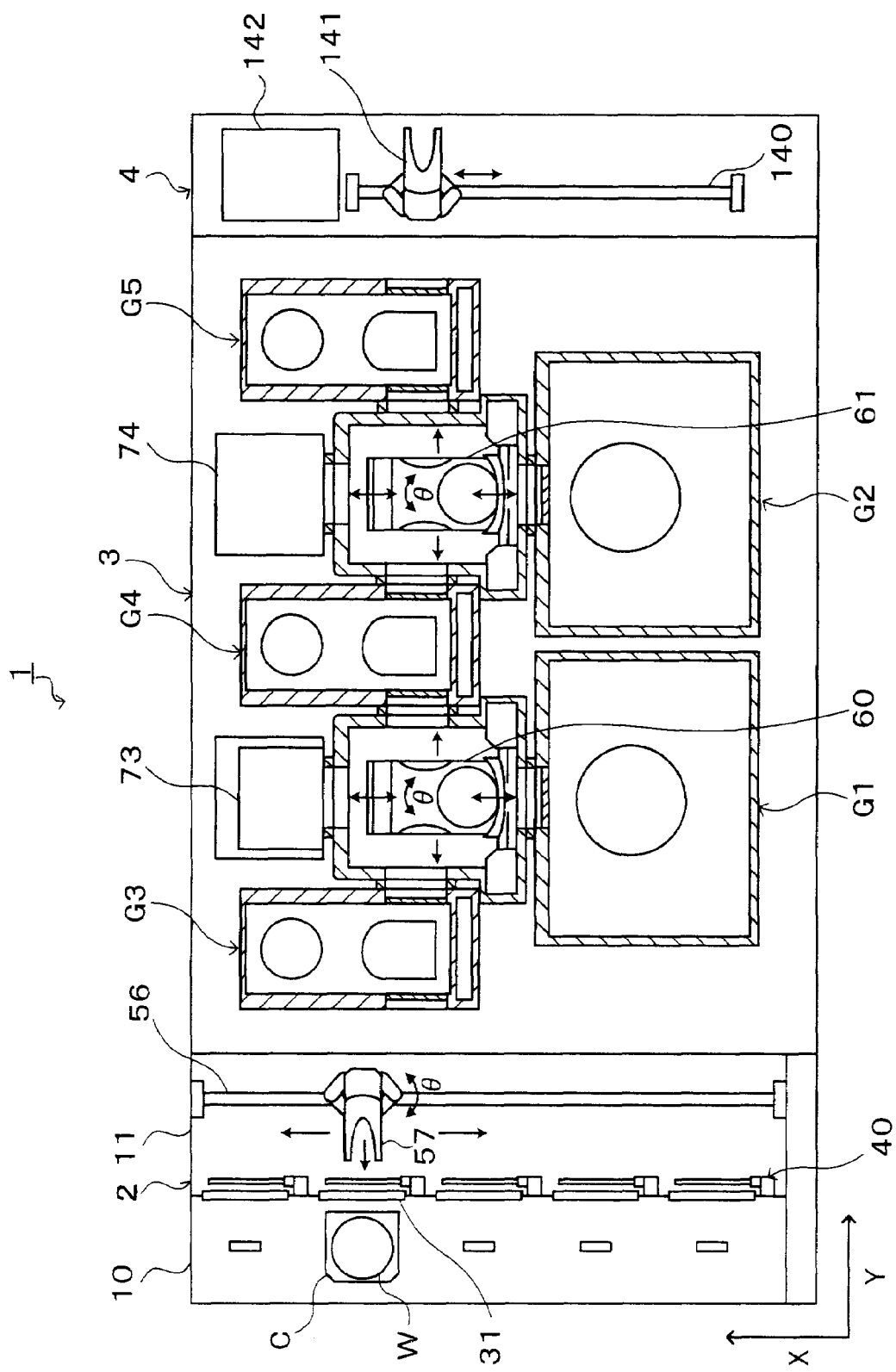
FIG. 1 is a plan view showing the outline of a configuration of a coating and developing treatment system incorporating a mapping unit according to this embodiment.

Hereinafter, preferred embodiments of the present invention will be described. FIG. 1 is a plan view showing the outline of a configuration of a coating and developing treatment system 1 incorporating mapping units 40 as substrate detecting apparatuses according to the embodiments.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography step; and an interface section 4 for passing the wafers W to/from an aligner (not shown) provided adjacent to the processing station 3, are integrally connected together.

The cassette station 2 has a mounting table 10 on which a plurality of cassettes C can be mounted in a line in an X-direction (a top-to-bottom direction in FIG. 1), and a transfer section 11 for transferring the wafer W between the cassette C and the processing station 3. On the transfer section 11 side of the mounting table 10, door openers 31 for opening/closing the cassettes C are provided opposing the cassettes. In the transfer section 11, a wafer transfer body 57 is provided which is movable in the X-direction on a transfer path 56. The wafer transfer body 57 is also movable in an arrangement direction of the wafers W housed in the cassette C (a Z-direction; the vertical direction), and thus can selectively access the wafer W in each of the cassettes C arranged in the X-direction.

The wafer transfer body 57 is rotatable in a θ-direction around a Z-axis and can access a temperature regulating unit 80 and a transition unit 81 included in a later-described third processing unit group G3 on the processing station 3 side. Further, the mapping units 40 as detecting apparatuses according to the embodiment are provided on the mounting table 10 side of the transfer section 11 between the cassettes C and the wafer transfer body 57 and at positions opposing the cassettes C with the door openers 31 intervening therebetween.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 60 is provided. The first transfer unit 60 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 61 is provided. The second transfer unit 61 can selectively access the processing and treatment units in the second processing unit group G2, the fourth processing unit group G4, and the fifth processing unit group G5 and transfer the wafer W to them.

Figure 2:
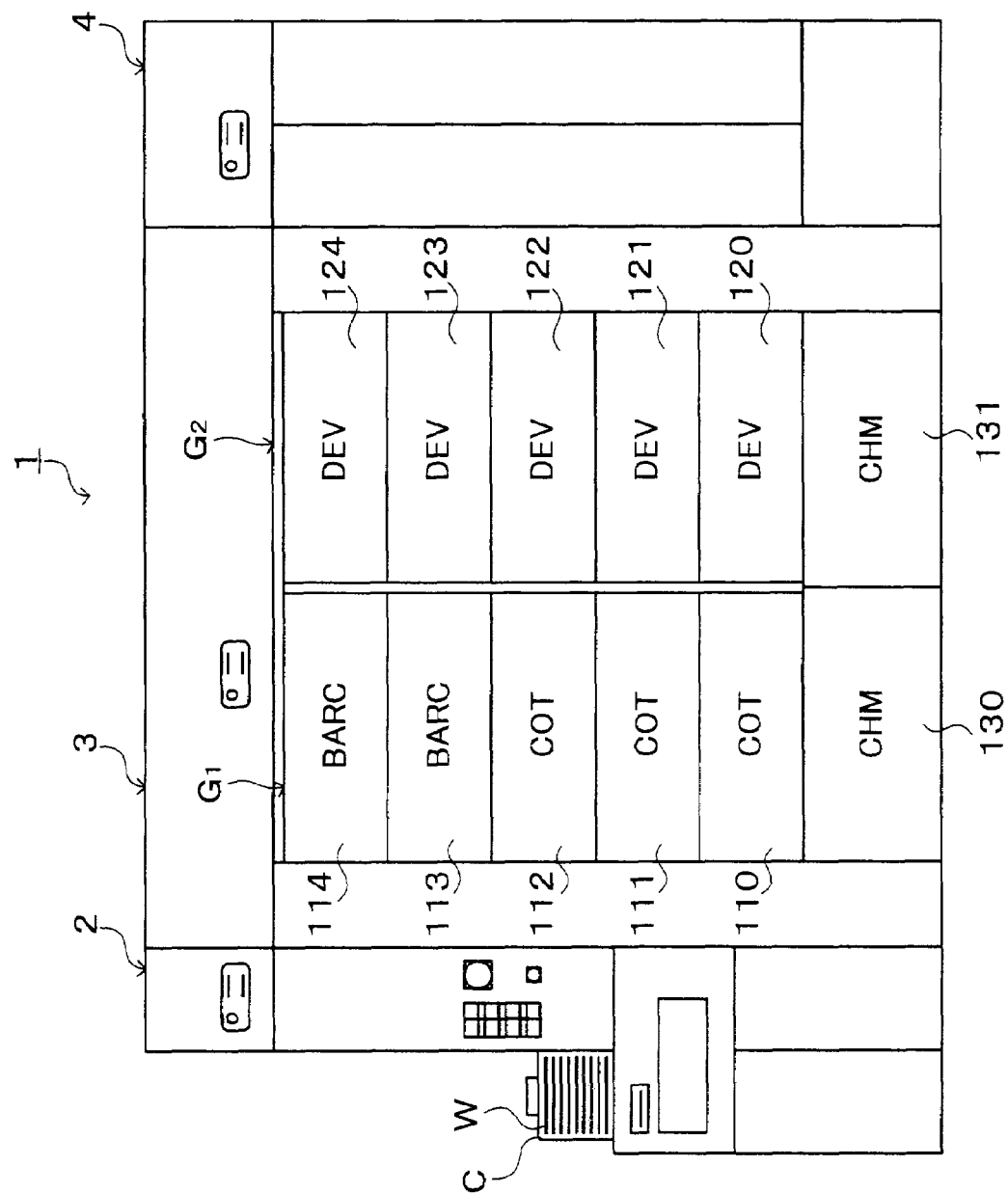
FIG. 2 is a front view of the coating and developing treatment system in FIG. 1.

In the first processing unit group G1, as shown in FIG. 2, solution treatment units each for supplying a predetermined liquid to the wafer W to perform treatment, for example, resist coating units 110 to 112 each for applying a resist solution to the wafer W, and bottom coating units 113 and 114 each for forming an anti-reflection film that prevents reflection of light at the time of exposure processing, are five-tiered in order from the bottom. In the second processing unit group G2, solution treatment units, for example, developing treatment units 120 to 124 each for supplying a developing solution to the wafer W to develop it are five-tiered in order from the bottom. Further, chemical chambers 130 and 131 for supplying various kinds of treatment solutions to the solution treatment units in the processing unit groups G1 and G2 are provided at the lowermost tiers of the first processing unit group G1 and the second processing unit group G2, respectively.

Figure 3:
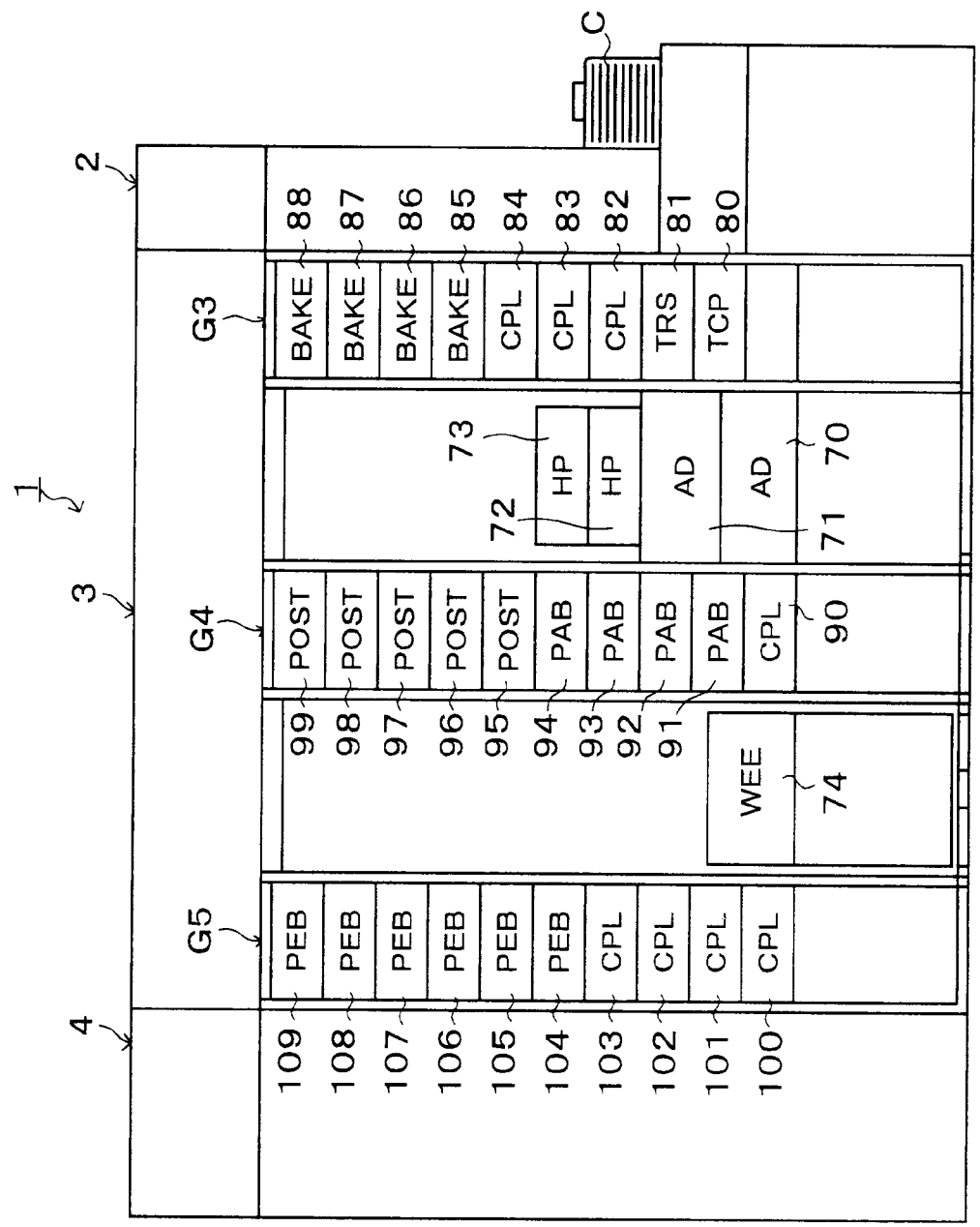
FIG. 3 is a rear view of the coating and developing treatment system in FIG. 1.

As shown in FIG. 3, in the third processing unit group G3, for example, the temperature regulating unit 80, the transition unit 81 for passing the wafer W, high-precision temperature regulating units 82 to 84 each for regulating the temperature of the wafer W under a high precision temperature control, and high-temperature thermal processing units 85 to 88 each for heat-processing the wafer W at a high temperature, are nine-tiered in order from the bottom.

In the fourth processing unit group G4, for example, a high-precision temperature regulating unit 90, pre-baking units 91 to 94 each for heat-processing the wafer W after resist coating treatment, and post-baking units 95 to 99 each for heat-processing the wafer W after developing treatment, are ten-tiered in order from the bottom.

In the fifth processing unit group G5, a plurality of thermal processing units each for thermally processing the wafer W, for example, high-precision temperature regulating units 100 to 103, and post-exposure baking units 104 to 109 are ten-tiered in order from the bottom.

As shown in FIG. 1, on the positive direction side in the X-direction to the first transfer unit 60, a plurality of processing and treatment units are arranged, for example, adhesion units 70 and 71 each for performing hydrophobic treatment on the wafer W and heat processing units 72 and 73 each for heating the wafer W are four-tiered in order from the bottom as shown in FIG. 3. As shown in FIG. 1, on the positive direction side in the X-direction to the second transfer unit 61, for example, an edge exposure unit 74 is disposed which selectively exposes only the edge portion of the wafer W to light.

In the interface section 4, for example, a wafer transfer body 141 moving on a transfer path 140 extending in the X-direction and a buffer cassette 142 are provided as shown in FIG. 1. The wafer transfer body 141 is movable in the Z-direction and also rotatable in the θ-direction, and thus can access the aligner (not shown) adjacent to the interface section 4, the buffer cassette 142, and the fifth processing unit group G5 and transfer the wafer W to them.

Next, configurations of the above-described mapping unit 40, the cassette C for which the mapping unit 40 performs a mapping operation, and the door opener 31 for opening/closing the cassette C will be described.

Figure 4:
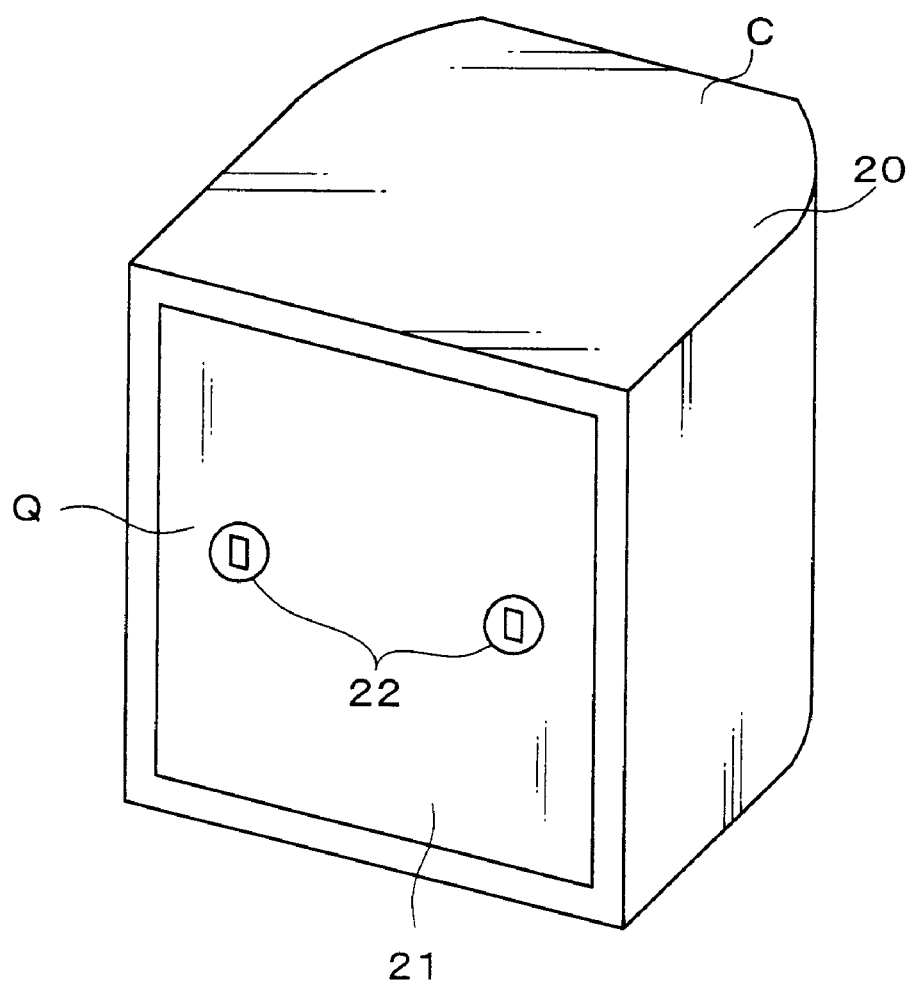
FIG. 4 is perspective view of a cassette.

The cassette C mounted on the mounting table 10 has, for example, a casing 20 that is capable of hermetically closing its inside as shown in FIG. 4 having on one side surface a transfer-in/out port Q through which the wafer W enters and exits, and a door 21 is attached to the transfer-in/out port Q. The door 21 is provided with a lock function, and the outer surface of the door 21 is provided with key holes 22 for releasing the lock. The door 21 is opened by inserting later-described keys 33 of the door opener 31 into the key holes 22 and releasing the lock.

Figure 5:
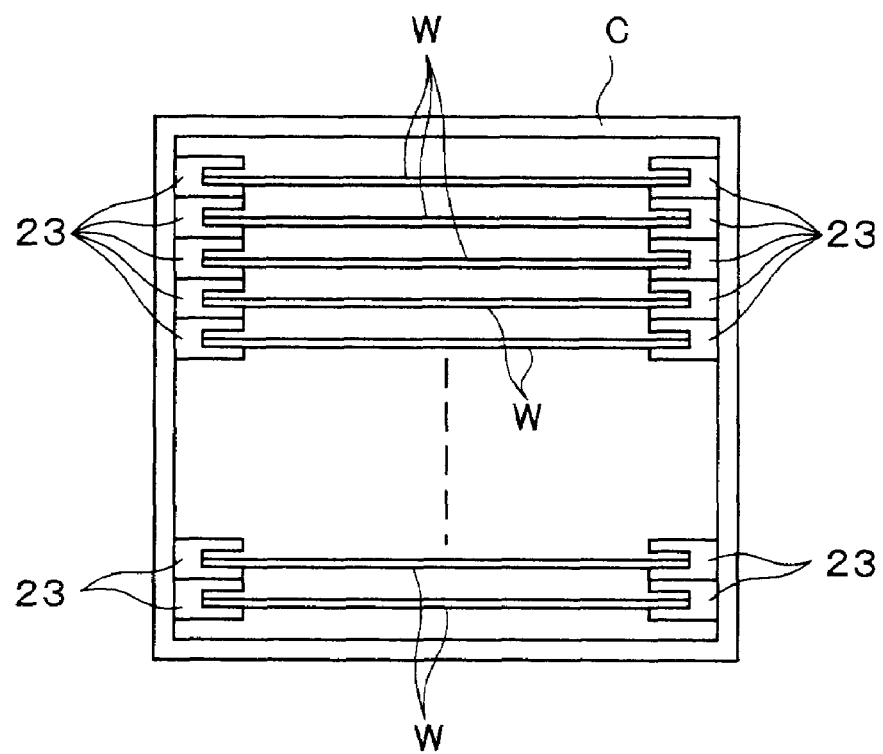
FIG. 5 is a side view of the cassette with its door open.

The cassette C is provided with a plurality of, for example, 25 slots 23 each for holding the outer periphery of the wafer W to horizontally support the wafer W as shown in FIG. 5. The slots 23 are provided at regular intervals in the vertical direction, so that the cassette C can house the 25 wafers W at multiple tiers by inserting the wafers W into the slots 23, respectively.

Figure 6:
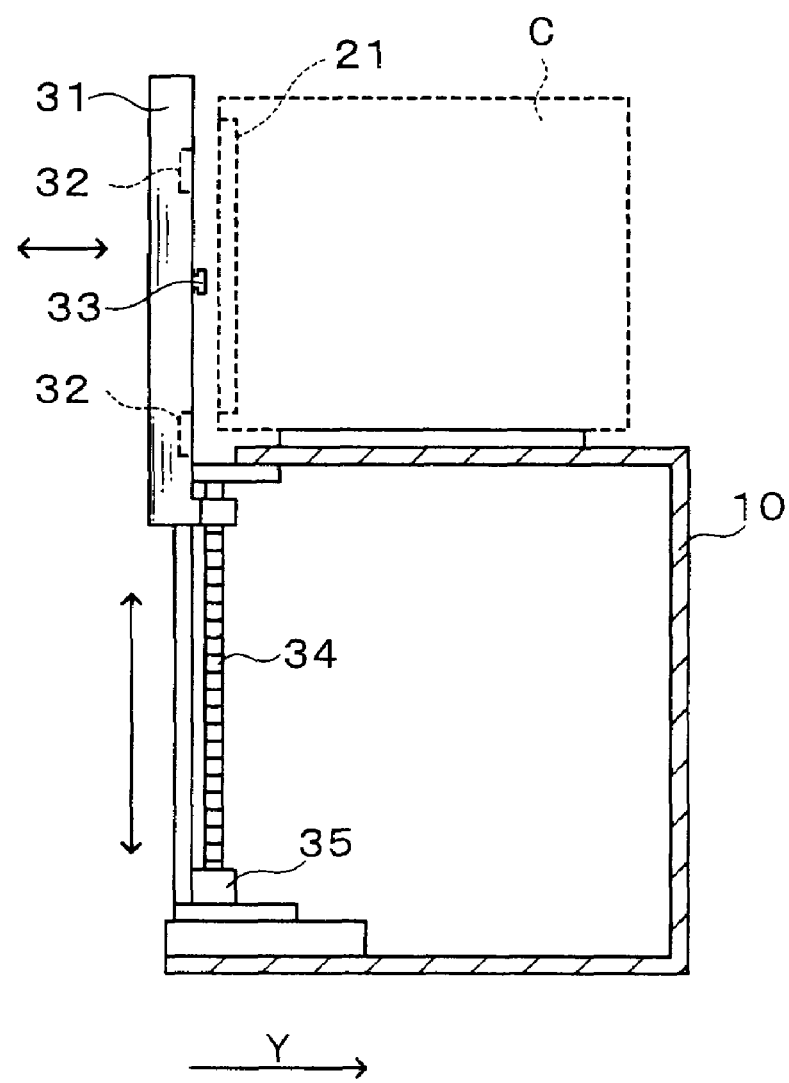
FIG. 6 is an explanatory view showing a longitudinal section showing a configuration of a door opener and its periphery.

On the transfer section 11 side of the mounting table 10, the door opener 31 is provided for automatically opening/closing the door 21 of the cassette C as shown in FIG. 6. The door opener 31 is shaped, for example, in a square flat plate, and its surface is provided with a suction port 32 for holding the door 21 by suction and the keys 33 for releasing the lock of the door 21.

The door opener 31 is attached to a ball screw 34 provided in the vertical direction, for example, in the mounting table 10, so that the door opener 31 can move in the vertical direction by means of a drive unit 35 such as a motor, a cylinder, or the like. Accordingly, the door opener 31 can be moved down from above the mounting table 10 and housed into the mounting table 10. The door opener 31 comprises a horizontal drive mechanism including, for example, a cylinder or the like (not shown) to be able to slide also in the Y-direction toward the mounting table 10. Accordingly, once the cassette C is mounted on the mounting table 10, the door opener 31 can slide toward the cassette C on the mounting table 10, hold the door 21 of the cassette C by suction, and then lower to thereby open the door 21.

Figure 7:
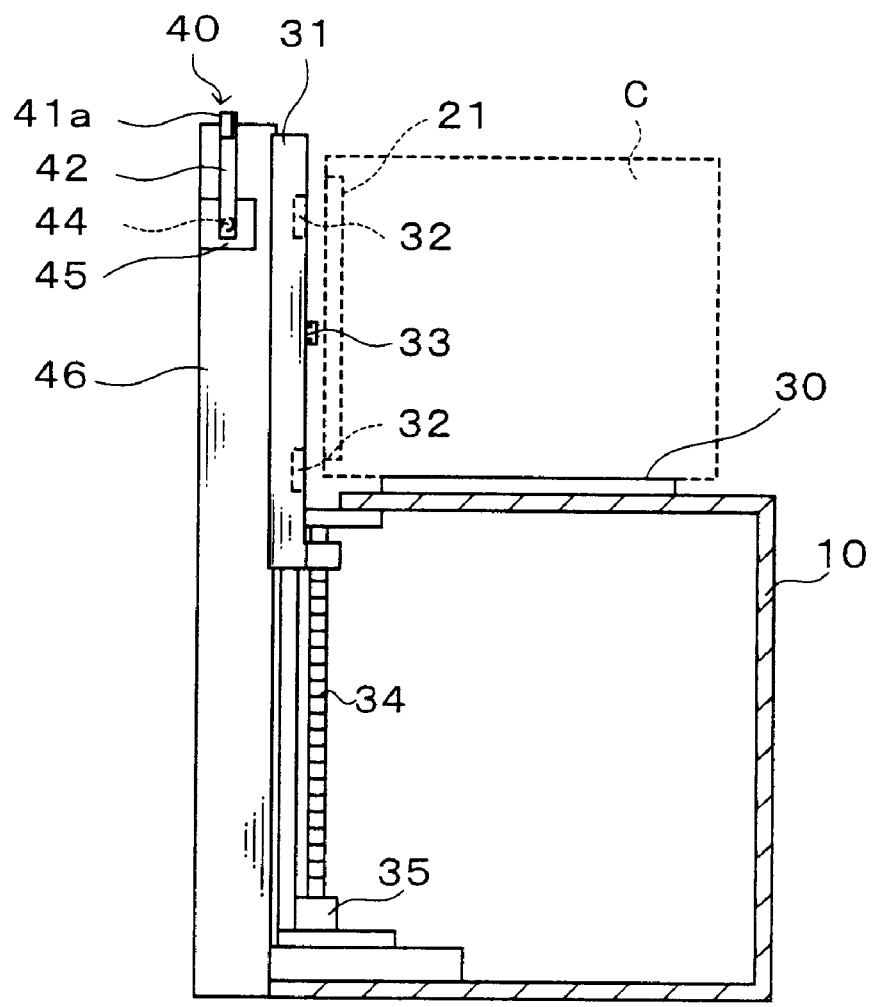
FIG. 7 is an explanatory view showing a longitudinal section showing a configuration of a mounting table with the mapping unit attached thereto and its periphery.

The mapping unit 40 is disposed at a position opposing the transfer-in/out port Q of the cassette C with the door opener 31 intervening therebetween as shown in FIG. 1 and FIG. 7 at which a later-described optical sensor 41 can enter the cassette C. The mapping unit 40 is provided for each cassette C so that the mapping operation is performed for each cassette C. Further, the mapping unit 40 is attached, for example, to the floor of the transfer section 11 by a detachable attachment member or the like so that it can be detached from the coating and developing treatment system 1 as necessary.

Figure 8:
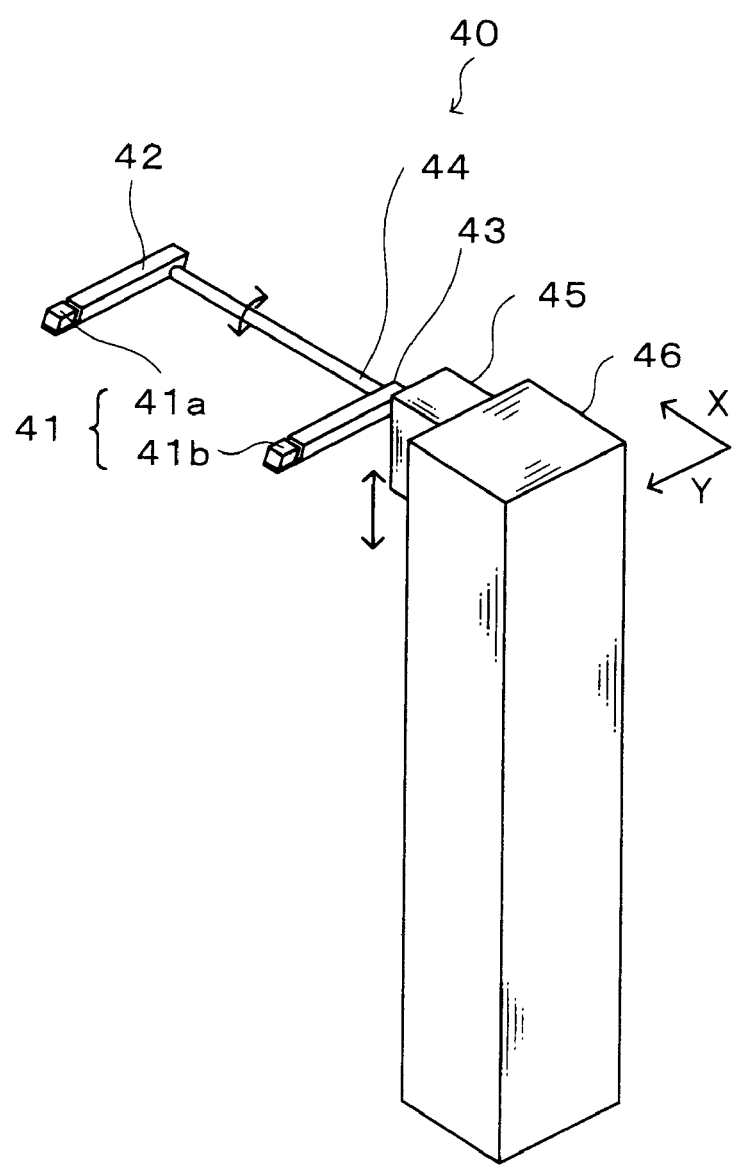
FIG. 8 is a perspective view of the mapping unit.
Figure 9:
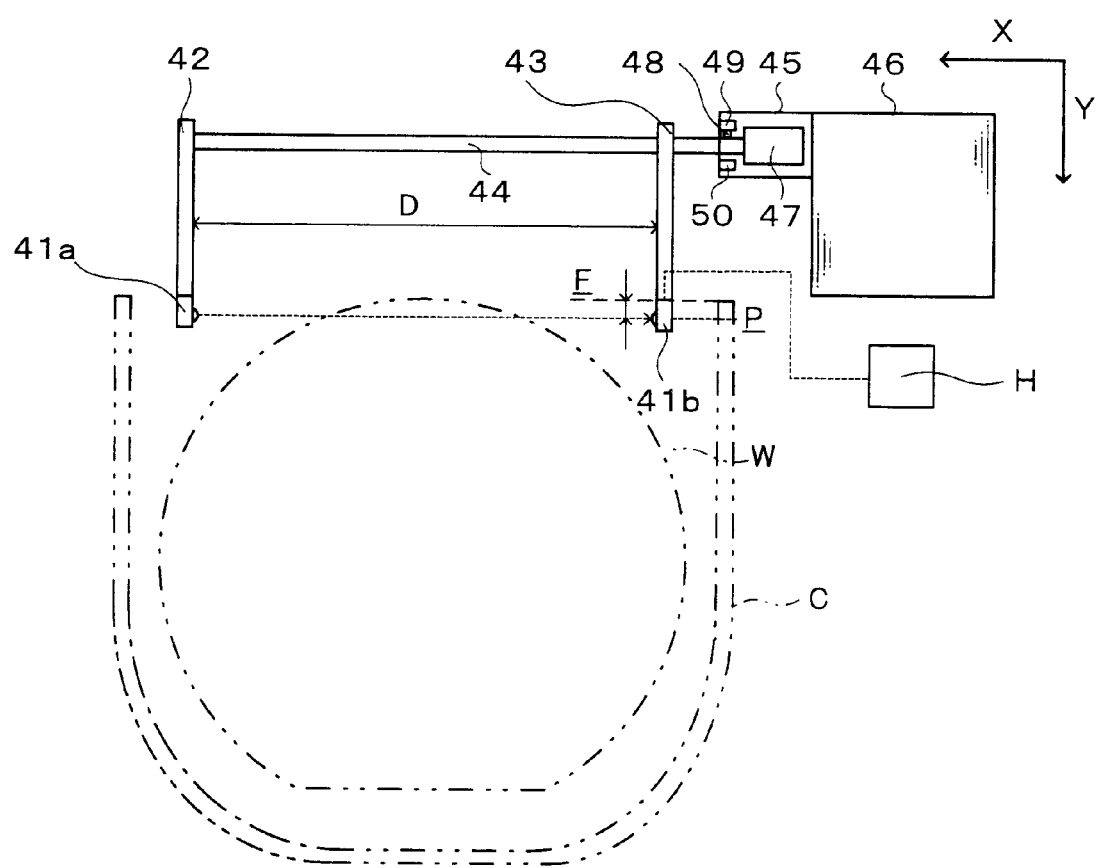
FIG. 9 is an explanatory view of a transverse section of the cassette showing a state in which an optical sensor enters into the cassette.

The mapping unit 40 comprises the optical sensor 41 for optically detecting the mounting state of the wafer W in the cassette C as shown in FIG. 8. The optical sensor 41 comprises, for example, a light emitting part 41a for applying linear LED light in the horizontal direction and a light receiving part 41b for receiving the LED light. The light emitting part 41a is fixed to an end on the cassette C side (the positive direction side in the Y-direction) of a supporting arm 42 and the light receiving part 41b is fixed to an end on the cassette C side of a supporting arm 43 such that the light emitting part 41a and the light receiving part 41b face each other separated by a predetermined distance D as shown in FIG. 9. The predetermined distance D is determined to be smaller than the transverse width of the cassette C and such that the light emitting part 41a and the light receiving part 41b hold ends of the wafer W therebetween as seen from above when the light emitting part 41a and the light receiving part 41b enter to a detection position P that is located in the cassette C at a particular distance F inside from the transfer-in/out port Q side. Then, the LED light is emitted from the light emitting part 41a toward the light receiving part 41b, so that whether or not a wafer W that is a light blocking object lies between them can be detected depending on the presence or absence of the light reception of the LED light at the light receiving part 41b. The detection data of the light receiving part 41b is outputted, for example, to a control unit H.

A supporting shaft 44 is inserted into the other ends of the supporting arms 42 and 43 so that the supporting arms 42 and 43 are individually fixed to the supporting shaft 44. The supporting shaft 44 extends in the horizontal direction such that its longitudinal direction is in the X-direction, and a rotation mechanism 45 for rotating the supporting shaft 44 is disposed at the end portion of the supporting shaft 44. Inside a cover 45a, for example, in a rectangle parallelepiped shape of the rotation mechanism 45, a drive unit 47 is provided which is composed of, for example, a motor, and the end portion of the supporting shaft 44 is connected to the drive unit 47. Accordingly, driving of the drive unit 47 allows the supporting shaft 44 to rotate. The rotation of the supporting shaft 44 then allows the light emitting part 41a and the light receiving part 41b of the optical sensor 41 to enter to the detection position P as shown in FIG. 10.

Figure 10:
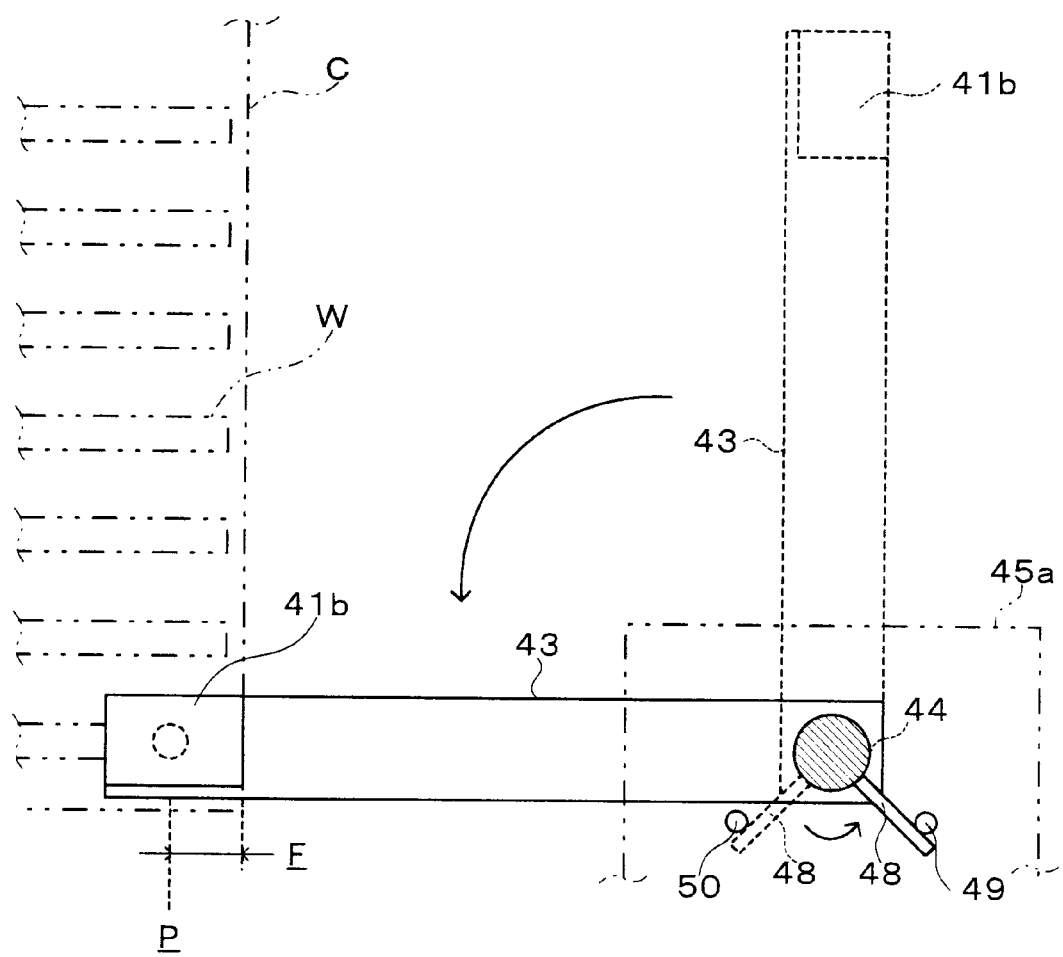
FIG. 10 is an explanatory view of a longitudinal section showing an internal configuration of the mapping unit.

As shown in FIG. 9 and FIG. 10, a stopper 48 is provided on a circumferential surface of the supporting shaft 44 located near the inner side surface on the supporting arm 43 side (the positive direction side in the X-direction) of the cover 45a. On the inner side surface on the supporting arm 43 side of the cover 45a, stopper receiving parts 49 and 50 are provided at two locations respectively each for receiving the stopper 48. The stopper receiving part 49 is provided on the transfer section 11 side (the negative direction side in the Y-direction) with respect to the supporting shaft 44.

The position of the stopper receiving part 49 is set at a position where the stopper 48 butts against it such that the supporting arms 42 and 43 keep their horizontal states. The stopper receiving part 50 is provided on the cassette C side (the positive direction side in the Y-direction) with respect to the supporting shaft 44. The position of the stopper receiving part 50 is set at a position where the stopper 48 butts against it such that the supporting arms 42 and 43 keep their standing states vertically above the supporting shaft 44. In other words, the rotation range of the supporting shaft 44 is restricted by the stopper 48 and the stopper receiving parts 49 and 50, whereby the supporting arms 42 and 43 can stand on the cassette C side from the horizontal direction until they are located vertically above the supporting shaft 44.

On the other side surface (on the negative direction side in the X-direction) of the rotation mechanism 45, a raising and lowering mechanism 46 is provided for raising and lowering the rotation mechanism 45 and the supporting shaft 44. The raising and lowering mechanism 46 is disposed on the negative direction side in the X-direction with respect to the door opener 31 and not to be located at a position in front of the transfer-in/out port Q of the cassette C, for example, as shown in FIG. 1.

Figure 11:
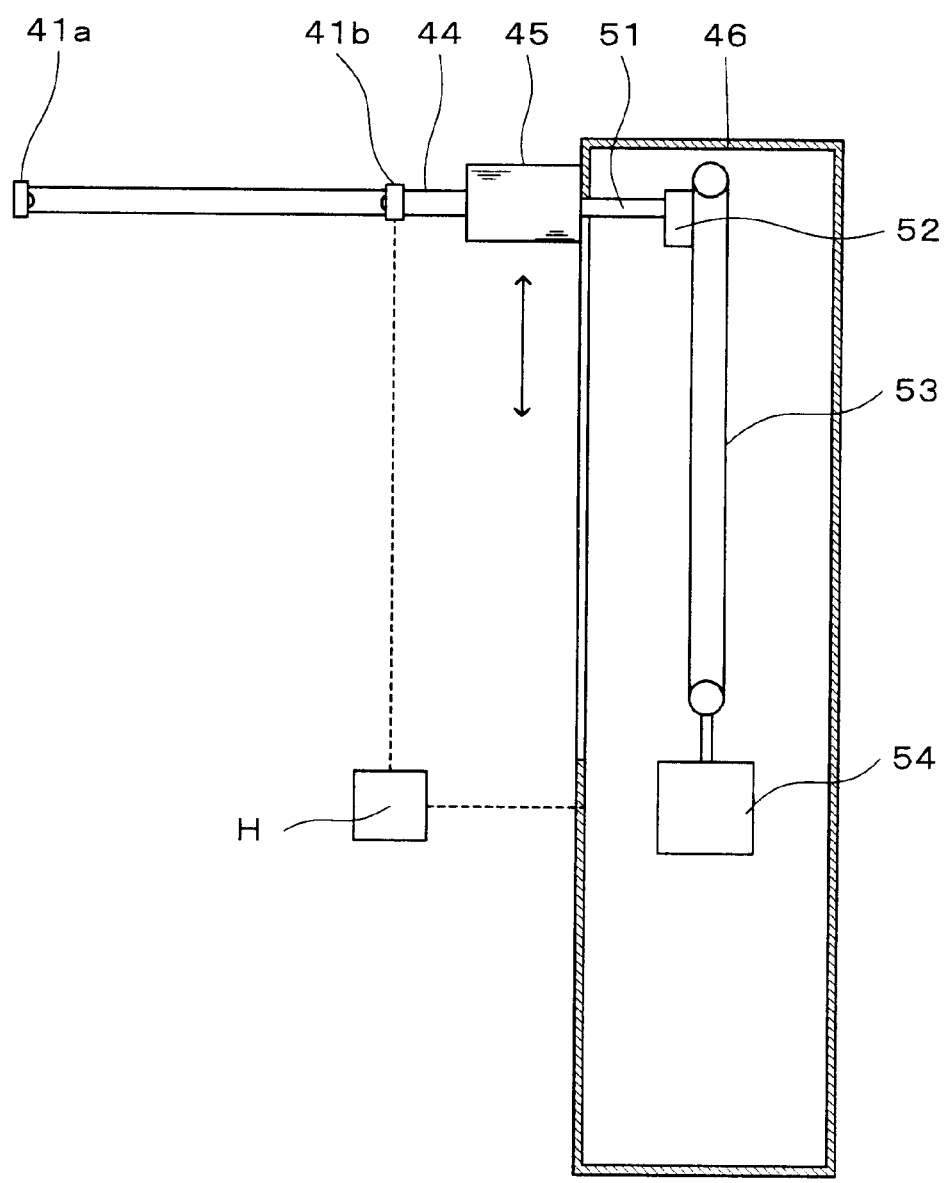
FIG. 11 is an explanatory view of a longitudinal section showing an internal configuration of the mapping unit.

The raising and lowering mechanism 46 has a main portion composed of a holding member 51 fixed to the rotation mechanism 45, a bracket 52 for supporting the holding member 51, a belt 53 having the bracket 52 locked thereto and extending in the vertical direction, and a drive unit 54 composed of, for example, a motor for driving the belt 53 as shown in FIG. 11. The raising and lowering mechanism 46 can raise and lower the rotation mechanism 45 and the supporting shaft 44 by a predetermined distance by driving the belt 53 by the drive unit 54.

The control of the drive unit 54 is performed by the control unit H, and the control unit H can control the moving amount in the vertical direction of the belt 53 to control the position for the optical sensor 41. Accordingly, the control unit H can detect the presence or absence of the wafer W at each tier in the cassette C and the apparent thickness of the wafer W as seen from the side surface by allowing the optical sensor 41 to scan in the vertical direction and to detect the presence or absence of the light blocking object in the cassette C while checking the position in the vertical direction of the optical sensor 41. Since the apparent thickness is large, for example, when the wafer W is supported inclined in the slot 23 or the like, the control unit H can recognize the housing attitude of the wafer W based on the detection data of the apparent thickness. More specifically, the control unit H can recognize the housing state of the presence or absence and the housing attitude of the wafer W in each slot 23 through the scan by the optical sensor 41.

The coating and developing treatment system 1 incorporating the mapping units 40 according to this embodiment is configured as described above, and wafer processing to be performed in the coating and developing treatment system 1 will be described next.

First of all, a cassette C housing a plurality of unprocessed wafers W is mounted onto the mounting table 10. When the cassette C is mounted, the door opener 31 horizontally moves, for example, toward the cassette C side to hold the door 21 of the cassette C by suction. In this event, the keys 33 of the door opener 31 are inserted into the key holes 22 of the door 21 to release the lock of the door 21. After holding the door 21, the door opener 31 once retracts from the cassette C in the horizontal direction and then lowers. This opens the inside of the cassette C toward the transfer section 11.

Figure 12:
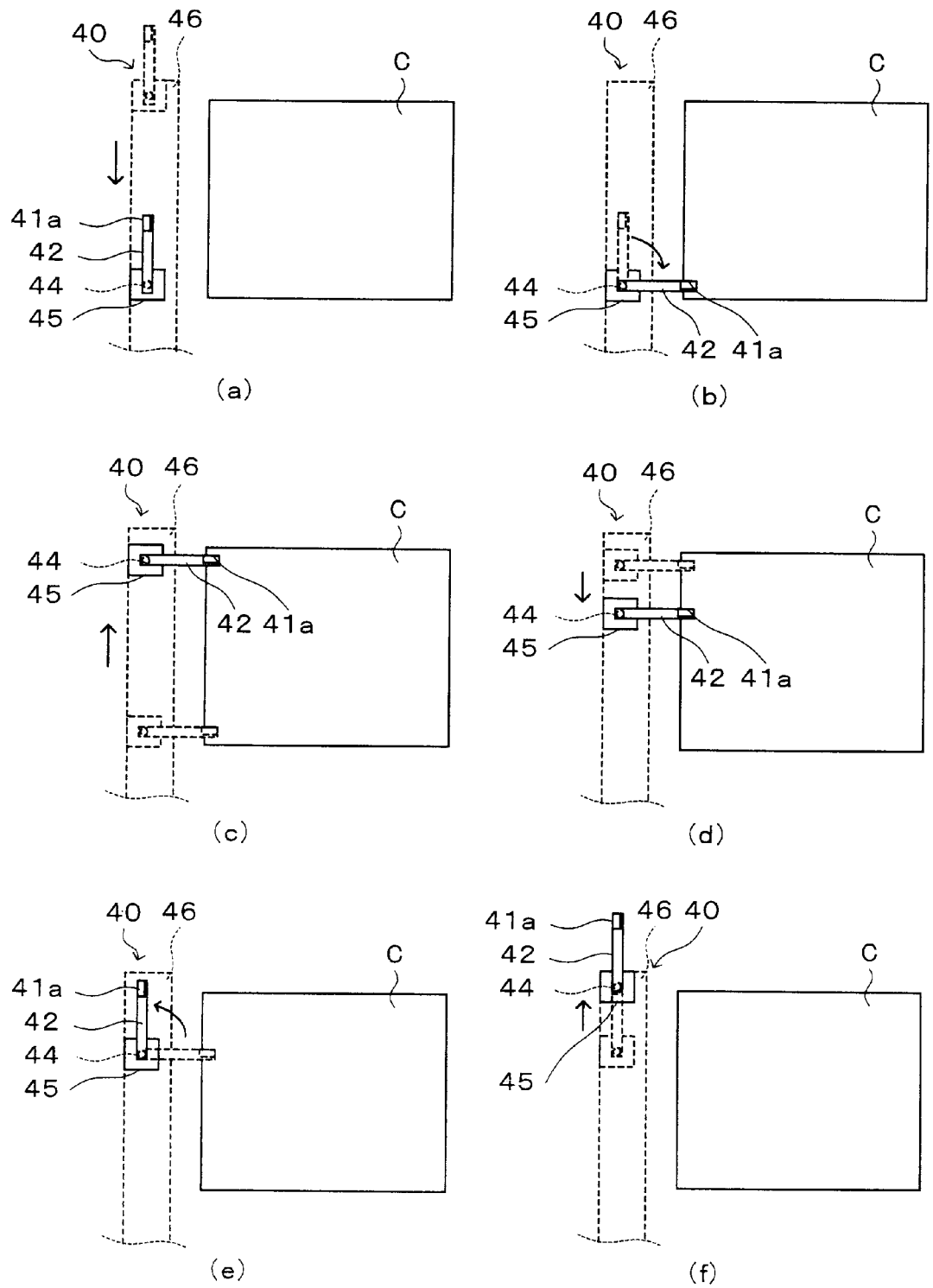
FIG. 12 is an explanatory view showing steps of a method of detecting a wafer according to an embodiment.

The supporting shaft 44 then lowers from a position higher than the cassette C to the lowermost portion of the cassette C while the supporting arms 42 and 43 are located vertically above the supporting shaft 44 (FIG. 12(*a*)). Subsequently, the supporting shaft 44 rotates, and the optical sensor 41 enters the lowermost portion of the cassette C (FIG. 12(*b*)). In this event, the light emitting part 41*a* and the light receiving part 41*b* move to the above-described detection position P as show in FIG. 9.

The LED light is then applied from the light emitting part 41 a to the light receiving part 41*b*, and in this state the light emitting part 41*a* and the light receiving part 41*b* are raised along the wafers W arranged in the vertical direction (FIG. 12(*c*)). In this event, the optical sensor 41 composed of the light emitting part 41*a* and the light receiving part 41*b* detects the presence or absence and the apparent thickness of the wafer W in each slot 23. This detection data is processed, for example, in the control unit H, and the presence or absence and the housing attitude of the wafer W in each slot 23 are recognized by the control unit H.

When the optical sensor 41 moves from the lowermost portion to the uppermost portion of the cassette C, whereby the presence or absence and the housing attitude of the wafer W at each tier are recognized, the mapping data is transmitted from the control unit H to a controller (not shown) of the wafer transfer body 57 and reflected in the operation recipe of the wafer transfer body 57. For example, the operation recipe for the wafer transfer body 57 is modified so that the wafer transfer body 57 accesses the slots 23 skipping the slot 23 supporting no wafer W and the slot 23 not horizontally supporting the wafer W.

After the optical sensor 41 moves to the uppermost portion of the cassette C and the application of the LED light from the light emitting part 41 a is stopped to complete the mapping operation, the supporting shaft 44 lowers to a predetermined position (FIG. 12(*d*)). The predetermined position is set at a position where the supporting arms 42 and 43 never interfere with the cassette C, for example, when the supporting arms 42 and 43 stand by the rotation of the supporting shaft 44. The supporting shaft 44 rotates until the supporting arms 42 and 43 stand vertically above the support shaft 44 (FIG. 12(*e*)). The supporting shaft 44 moves to a position higher than the cassette C with the supporting arms 42 and 43 being located vertically above the supporting shaft 44, and waits until the next cassette C is mounted (FIG. 12(*f*)).

The wafer transfer body 57 then accesses the wafers W in predetermined slots 23 in the cassette C, and transfers the wafers W one by one to the temperature regulating unit 80 in the third processing unit group G3. The wafer W after temperature-regulated to a predetermined temperature in the temperature regulating unit 80, is transferred to the bottom coating unit 113, where an anti-reflection film is formed on its surface. The wafer W is then transferred to the heating unit 72, the high-temperature thermal processing unit 85 and the high-precision temperature regulating unit 90 in sequence so that predetermined processing is performed in each of the units, and thereafter transferred to the resist coating unit 20 where a resist film is formed on the wafer W.

The wafer W is thereafter transferred to the pre-baking unit 91 and subsequently transferred to the edge exposure unit 74 and the high-precision temperature regulating unit 103 in sequence so that the wafer W is subjected to predetermined processing in each of the units. The wafer W is then transferred to the aligner (not shown), where the wafer is exposed to light, and is then transferred to the post-exposure balking unit 104 and subjected to predetermined processing. The wafer W is then transferred to the high-precision temperature regulating unit 101, where the wafer W is temperature-regulated, and then transferred to the developing treatment unit 120, where the resist film on the wafer W is developed. The wafer W is then transferred to the post-baking unit 95, where the wafer W is subjected to heat processing, and then transferred to the high-precision temperature regulating unit 83, where the wafer W is temperature-regulated. The wafer W is then transferred to the transition unit 81 and returned to the cassette C by the wafer transfer body 57. Thus, a series of photolithography step is completed.

According to this embodiment, the mapping unit 40 comprises the rotation mechanism 45, and the rotation mechanism 45 rotates the supporting shaft 44 to allow the optical sensor 41 to be capable of accessing the cassette C. Accordingly, it becomes unnecessary to horizontally slide the supporting shaft 44, unlike the prior art, thus eliminating the space in the horizontal direction in the processing unit which has been conventionally secured for sliding. This can result in reduced sized of the coating and developing treatment system 1 as compared to the conventional one.

Further, since the optical sensor 41 moves to the detection position P in the cassette C and the optical sensor 41 is raised and lowered by the raising and lowering mechanism 46, the optical sensor 41 can scan along the wafers W in the cassette C and properly perform the mapping operation.

Since the stopper 48 is provided on the supporting shaft 44 and the stopper receiving part 49 for receiving the stopper 48 is provided on the rotation mechanism 45, the rotation range of the supporting shaft 44 can be restricted, whereby the supporting arms 42 and 43 can be kept in the horizontal state, for example, without falling downward from the horizontal direction. Further, since the stopper receiving part 50 is provided, the supporting arms 42 and 43 never fall down toward the transfer section 11 from vertically above the supporting shaft 44. Accordingly, the supporting arms 42 and 43 can stand up on the cassette C side until they are located from the horizontal direction to vertically above the supporting shaft 44. The stopper receiving part 50 prevents the supporting arms 42 and 43 from falling down toward the transfer section 11, thus making it possible to prevent the supporting arms 42 and 43 from bumping with or interfering with, for example, the wafer transfer body 57 or the like even if the rotation mechanism 45 has any trouble.

Since the raising and lowering mechanism 46 is disposed at a position off the front of the transfer-in/out port Q of the cassette C, and the supporting shaft 44 is raised/lowered to/from a position higher than the cassette C, the mapping unit 40 is never located in front of the transfer-in/out port Q of the cassette C when the mapping operation is not being performed. Accordingly, it is possible to prevent the mapping unit 40 from hindering the transfer-in/out of the wafer W to/from the cassette C.

Although the stopper 48 and the stopper receiving parts 40 and 50 restrict the supporting arms 42 and 43 such that the supporting arms 42 and 43 stand up on the cassette C side after they are horizontally located until they are located vertically above the supporting shaft 44 in the above embodiment, the stopper 48 and the stopper receiving parts 40 and 50 may restrict the supporting arms 42 and 43 such that the supporting arms 42 and 43 fall down after they are horizontally located until they are located vertically below the supporting shaft 44.

Figure 13:
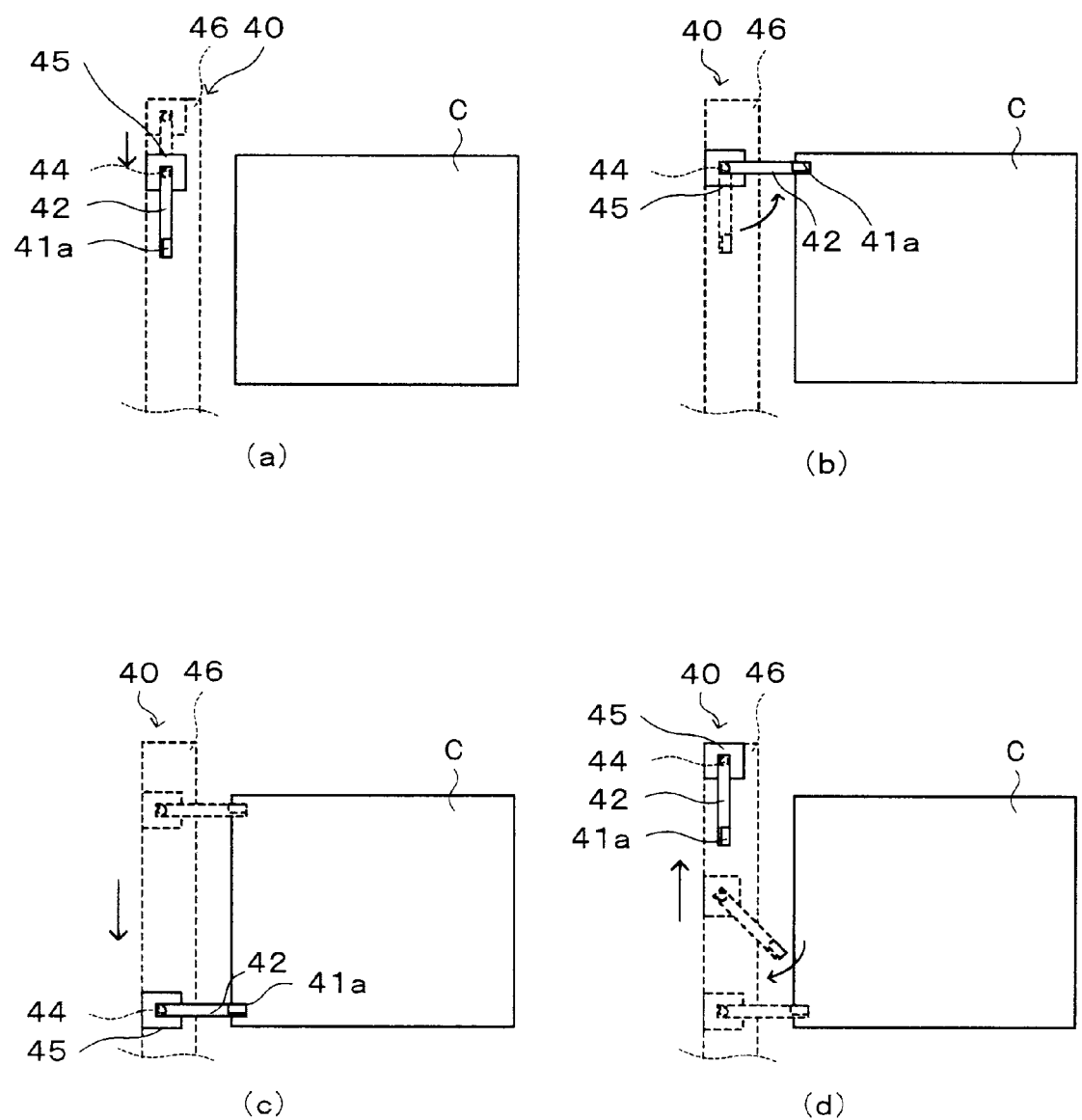
FIG. 13 is an explanatory view showing steps of a method of detecting a wafer according to another embodiment.

The mapping operation method by the mapping unit 40 in this case will be described based on FIG. 13.

After the door 21 of the cassette C is opened, the supporting shaft 44 is lowered from a position higher than the cassette C to the lowermost portion of the cassette C with the supporting arms 42 and 43 being located vertically below the supporting shaft 44 (FIG. 13(a)). Subsequently, the supporting shaft 44 rotates, the optical sensor 41 enters the uppermost portion of the cassette C, and the light emitting part 41a and the light receiving part 41b move to the detection position P (FIG. 13(b)). The LED light is applied from the light emitting part 41a to the light receiving part 41b, in which state the light emitting part 41a and the light receiving part 41b are lowered along the wafers W arranged in the vertical direction, whereby the presence or absence and the apparent thickness of the wafer W are detected (FIG. 13(c)).

After the optical sensor 41 moves to the lowermost portion of the cassette C and the application of the LED light from the light emitting part 41a is stopped to complete the mapping operation, the supporting shaft 44 is raised to a position higher than the cassette C while rotating until the supporting arms 42 and 43 are located vertically below the supporting shaft 44 (FIG. 13(d)).

According to the above embodiment, as preparation for the supporting shaft 44 to retract after the completion of the mapping operation, the supporting shaft 44 can rotate to return the supporting arms 42 and 43 to vertically below it without the supporting shaft 44 once lowering in a direction opposite to the progress direction. Accordingly, the supporting shaft 44 can rapidly rise.

Further, the supporting shaft 44 can be raised to a position higher than the cassette C without stop while rotating to allow the supporting arms 42 and 43 to fall down to vertically below it. Of course, the supporting shaft 44 may once stop at a predetermined position and further rise after the supporting shaft 44 rotates to allow the supporting arms 42 and 43 to fall down to vertically below it.

Further, the lengths of the supporting arms 42 and 43 can be changed by replacing the supporting arms 42 and 43 with others. This ensures that even when the conditions such as the size of the wafer W and the kind of the wafer W are different, the optical sensor 41 can be located at an appropriate position with respect to the wafer W to properly perform the mapping operation.

Preferred embodiments of the present invention have been described above with reference to the accompanying drawings, and the present invention is not limited to the embodiments. It should be understood that various changes and modifications within the scope of the spirit as set forth in claims are readily apparent to those skilled in the art, and those should also be covered by the technical scope of the present invention. The present invention is also applicable to the case where the substrate is a substrate other than the wafer W, such as an FPD (Flat Panel Display), a mask reticle for a photomask, and the like.

The present invention is useful in a detecting apparatus and a detecting method of detecting the housing state of a substrate.

What is claimed is:

1. A detecting apparatus for detecting housing states of substrates housed at multiple tiers vertically aligned in a housing body, said detecting apparatus being set on a transfer-in/out port side of the housing body for housing the substrates, comprising:
    an optical sensor including a light emitting part for horizontally applying a linear light and a light receiving part for receiving the light, and capable of optically detecting the housing states of the substrates;
    a pair of supporting arms supporting said light emitting part and said light receiving part of said optical sensor, respectively;
    a supporting shaft supporting said supporting arms and extended in a horizontal direction;
    a raising and lowering mechanism for raising and lowering said supporting shaft; and
    a rotation mechanism for rotating said supporting shaft to allow said optical sensor to enter said housing body and said supporting arms to fall down until the substrate is located between said light emitting part and said light receiving part.

2. The detecting apparatus as set forth in claim 1, wherein said supporting shaft is rotated to allow said supporting arms to fall down or stand up toward said transfer-in/out port of said housing body until said optical sensor is located vertically above or below said supporting shaft located outside said housing body.

3. The detecting apparatus as set forth in claim 1, wherein said supporting shaft includes a stopper, wherein said rotation mechanism side includes a stopper receiving part that butts against said stopper, and wherein said stopper and stopper receiving part obstruct the rotation of said supporting shaft to other than a detection position and a retraction position of said supporting shaft.

4. The detecting apparatus as set forth in claim 1, said raising and lowering mechanism is disposed at a position off the front of said transfer-in/out port of said housing body, and said raising and lowering mechanism is capable of raising and lowering said supporting shaft to/from above said housing body.

5. The detecting apparatus as set forth in claim 1, wherein the housing state of the substrate is the presence or absence and a housing attitude of the substrate at each tier in said housing body, and wherein said optical sensor is for detecting the presence or absence of a substrate at each tier in said housing body, and an apparent thickness of the substrate when the substrate housed in said housing body is seen from a side.

6. A detecting method of detecting housing states of substrates housed at multiple tiers vertically aligned in a housing body using a detecting apparatus set on a transfer-in/out port side of the housing body for housing the substrates,
said detecting apparatus comprising:
an optical sensor including a light emitting part for horizontally applying a linear light and a light receiving part for receiving the light, and capable of optically detecting the housing states of the substrates;
a pair of supporting arms supporting said light emitting part and said light receiving part of said optical sensor, respectively;
a supporting shaft supporting said supporting arms and extended in a horizontal direction;
a raising and lowering mechanism for raising and lowering said supporting shaft; and
a rotation mechanism for rotating said supporting shaft to allow said optical sensor to enter said housing body and said supporting arms to fall down until the substrate is located between said light emitting part and said light receiving part, and
said detecting method comprising the steps of:
lowering said supporting shaft from above said housing body to a lower portion of said housing body with said supporting arms being located vertically above said supporting shaft;
rotating said supporting shaft to allow said optical sensor to enter said housing body and said supporting arms to fall down until the substrate is located between said light emitting part and said light receiving pat; and
raising said supporting shaft to an upper portion of said housing body while applying light from said light emitting part of said optical sensor to said light receiving part to detect the housing states of the substrates.

7. The detecting methods as set forth in claim 6, further comprising the steps of:
after said detecting the housing states of the substrates,
stopping the application of light from said light emitting part of said optical sensor and lowering said supporting shaft to a predetermined position;
rotating said supporting shaft until said supporting arms are located vertically above said supporting shaft; and
raising said supporting shaft to above said housing body with said supporting arms being located vertically above said supporting shaft.

8. A detecting method of detecting housing states of substrates housed at multiple tiers vertically aligned in a housing body using a detecting apparatus set on a transfer-in/out port side of the housing body for housing the substrates,
said detecting apparatus comprising:
an optical sensor including a light emitting part for horizontally applying a linear light and a light receiving part for receiving the light, and capable of optically detecting the housing states of the substrates;
a pair of supporting arms supporting said light emitting part and said light receiving part of said optical sensor, respectively;
a supporting shaft supporting said supporting arms and extended in a horizontal direction;
a raising and lowering mechanism for raising and lowering said supporting shaft; and
a rotation mechanism for rotating said supporting shaft to allow said optical sensor to enter said housing body and said supporting arms to fall down until the substrate is located between said light emitting part and said light receiving part, and
said detecting method comprising the steps of:
rotating said supporting shaft from a state in which said supporting arms are located vertically below said supporting shaft at an upper portion of said housing body to allow said optical sensor to enter said housing body and said supporting arms to rise until the substrate is located between said light emitting part and said light receiving part; and
lowering said supporting shaft to a lower portion of said housing body while applying light from said light emitting part of said optical sensor to said light receiving part to detect the housing states of the substrates.

9. The detecting method as set forth in claim 8, further comprising the steps of
after said detecting the housing states of the substrates,
stopping the application of light from said light emitting part of said optical sensor and rotating said supporting shaft until said supporting arms are located vertically below said supporting shaft while raising said supporting shaft to the upper portion of said housing body.

* * * * *